United States Patent
Kim et al.

(10) Patent No.: US 11,244,586 B2
(45) Date of Patent: Feb. 8, 2022

(54) DISPLAY DEVICE AND DISPLAY MODULE TESTING METHOD

(71) Applicant: Samsung Display Co., Ltd., Yongin-Si (KR)

(72) Inventors: Gyunsoo Kim, Daejeon (KR); Kijong Kim, Cheonan-si (KR); Minki Kim, Hwaseong-si (KR); Seung Hwan Baek, Seoul (KR); In-Su Baek, Seoul (KR); Minsoo Shin, Ulsan (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/036,388

(22) Filed: Sep. 29, 2020

(65) Prior Publication Data
US 2021/0110746 A1    Apr. 15, 2021

(30) Foreign Application Priority Data

Oct. 14, 2019  (KR) ........................ 10-2019-0126938

(51) Int. Cl.
| | | |
|---|---|---|
| G09G 5/00 | (2006.01) | |
| G09G 3/00 | (2006.01) | |
| H01L 27/32 | (2006.01) | |
| G09G 3/3208 | (2016.01) | |
| G06F 3/041 | (2006.01) | |

(52) U.S. Cl.
CPC ........... *G09G 3/006* (2013.01); *H01L 27/323* (2013.01); *G06F 3/0412* (2013.01); *G09G 3/3208* (2013.01)

(58) Field of Classification Search
None
See application file for complete search history.

(56) References Cited

U.S. PATENT DOCUMENTS

| 10,310,690 B2 | 6/2019 | Fukushima |
| 2018/0329544 A1* | 11/2018 | Yeh ........................ G06F 3/0418 |
| 2019/0165288 A1 | 5/2019 | Odaka et al. |
| 2020/0152553 A1* | 5/2020 | Wu ...................... H01L 23/5387 |
| 2021/0109639 A1* | 4/2021 | Hsieh .................. G06F 3/04164 |

FOREIGN PATENT DOCUMENTS

| JP | 2017228162 A | 12/2017 |
| KR | 101409568 B1 * | 6/2014 |
| KR | 101628305 B1 | 6/2016 |
| KR | 101652303 B1 | 8/2016 |

* cited by examiner

*Primary Examiner* — Kirk W Hermann
(74) *Attorney, Agent, or Firm* — Cantor Colburn LLP

(57) ABSTRACT

A method of testing a display module includes preparing a display module, a first circuit connected to the display module, and a second circuit connected to the display module and connected to a guide part, disposing the first circuit on a first mounting part of a stage, disposing the second circuit and the guide part on the first circuit and a second mounting part adjacent to the first mounting part of the stage, testing the display module, and removing the guide part from the second circuit.

16 Claims, 11 Drawing Sheets

DISPLAY DEVICE AND DISPLAY MODULE TESTING METHOD

This application claims priority to Korean Patent Application No. 10-2019-0126938, filed on Oct. 14, 2019, and all the benefits accruing therefrom under 35 U.S.C. § 119, the content of which in its entirety is herein incorporated by reference.

BACKGROUND

1. Field

Embodiments of the invention herein relate to a display device having improved reliability and a display module testing method.

2. Description of the Related Art

Display modules may operate by receiving electrical signals. Each of the display modules may display an image and sense a touch by receiving an electrical signal from a circuit. The circuit is provided separately and may be connected to the display module through a flexible circuit film. Alternatively, the circuit is provided in a circuit board and may be directly connected to the display module.

SUMMARY

Embodiments of the invention provide a display device having improved reliability and a display module testing method.

An embodiment of the invention provides a display module testing method including preparing a display module, a first circuit connected to the display module, and a second circuit connected to the display module and connected to a guide part, disposing the first circuit on a first mounting part of a stage, disposing the second circuit and the guide part on the first circuit and a second mounting part adjacent to the first mounting part of the stage, testing the display module, and removing the guide part from the second circuit.

In an embodiment, the disposing the second circuit and the guide part may include disposing a portion of the guide part so as not to overlap the first circuit in a plan view.

In an embodiment, the disposing the second circuit and the guide part may include disposing a side surface of the guide part to face a side surface of the second mounting part.

In an embodiment, the first circuit may include a first circuit film and a first connector disposed on the first circuit film, and the second circuit may include a second circuit film and a second connector disposed on the second circuit film, where the disposing the second circuit and the guide part includes disposing the second circuit film and the second connector to overlap the first circuit film in a plan view.

In an embodiment, the disposing the second circuit and the guide part may further include disposing the first connector and the second connector so as not to overlap each other in the plan view.

In an embodiment, the guide part may be provided unitarily with the second circuit film.

In an embodiment, the second circuit film and the guide part may be provided unitarily with each other, and a plurality of holes may be defined in a boundary between the second circuit film and the guide part, where the removing the guide part includes removing the guide part along a direction in which the plurality of holes is defined.

In an embodiment, the disposing the second circuit and the guide part further may include defining the plurality of holes to overlap the first circuit film in the plan view.

In an embodiment, the removing the guide part may further include forming a protrusion on at least one side surface of the second circuit film from which the guide part is removed.

In an embodiment, the disposing the first circuit may include disposing a side surface of the first circuit film to face a side surface of the first mounting part.

In an embodiment, the testing the display module may include connecting a first test connector of a display module testing device to the first connector, and connecting a second test connector of the display module testing device to the second connector.

In an embodiment, the testing the display module may further include providing a display test signal to the first connector through the first test connector, and providing an input test signal to the second connector through the second test connector.

In an embodiment, the disposing the second circuit and the guide part may include disposing the guide part between the first circuit and the second circuit.

In an embodiment, the second circuit may include a second circuit film, a second connector disposed on the second circuit film, and a reinforcing part which is disposed below the second circuit film and supports the second connector, where the disposing the second circuit and the guide part further includes attaching the guide part to the reinforcing part.

In an embodiment, the guide part may be a magnet.

In an embodiment, the reinforcing part may be stainless steel.

An embodiment of the invention provides a display device including a display module, a first circuit connected to the display module and including a first circuit film and a first connector, and a second circuit connected to the display module and including a second circuit film and a second connector, where a protrusion is provided on at least one side surface of the second circuit film.

In an embodiment, the display module may include a display panel and an input sensor disposed on the display panel, where the first circuit is electrically connected to the display panel, and the second circuit is electrically connected to the input sensor.

In an embodiment, the second circuit may overlap the first circuit in a plan view.

In an embodiment, the first connector may not overlap the second connector in the plan view.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1:
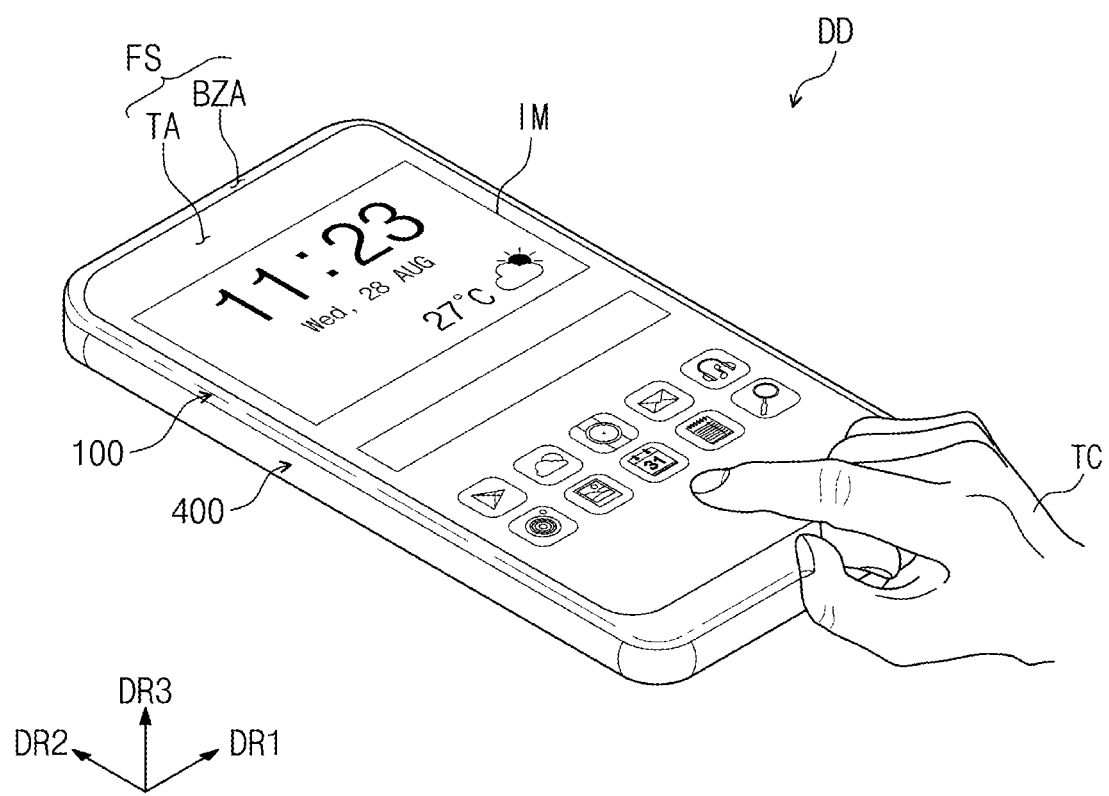
FIG. 1 is a perspective view of an embodiment of a display device according to the invention.

It will be understood that when an element (or a region, a layer, a portion, or the like) is referred to as being "on", "connected to" or "coupled to" another element or layer, it can be directly disposed on, connected or coupled to the other element or layer or intervening elements may be present.

Like numbers refer to like elements throughout. The thickness, the ratio, and the dimension of the element are exaggerated for effective description of the technical contents.

As used herein, the term "and/or" includes any and all combinations of one or more of the associated listed items.

It will be understood that, although the terms first, second, etc., may be used herein to describe various elements, these elements should not be limited by these terms. These terms are only used to distinguish one element from another element. A first element may be referred to as a second element, and similarly, a second element may be referred to as a first element without departing from the teachings of the present disclosure, for example. As used herein, the singular forms are intended to include the plural forms as well, unless the context clearly indicates otherwise.

Also, terms of "below", "lower", "above", "upper" may be used to describe the relationships of the components illustrated in the drawings. These terms have a relative concept, and are described on the basis of the directions illustrated in the drawings.

Unless otherwise defined, all terms (including technical and scientific terms) used herein have the same meaning as commonly understood by one of ordinary skill in the art to which the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, components, or a combination thereof, but do not preclude the presence or addition of one or more other features, integers, steps, operations, elements, components, or combinations thereof.

Hereinafter, embodiments of the invention will be described with reference to the accompanying drawings.

Figure 2:
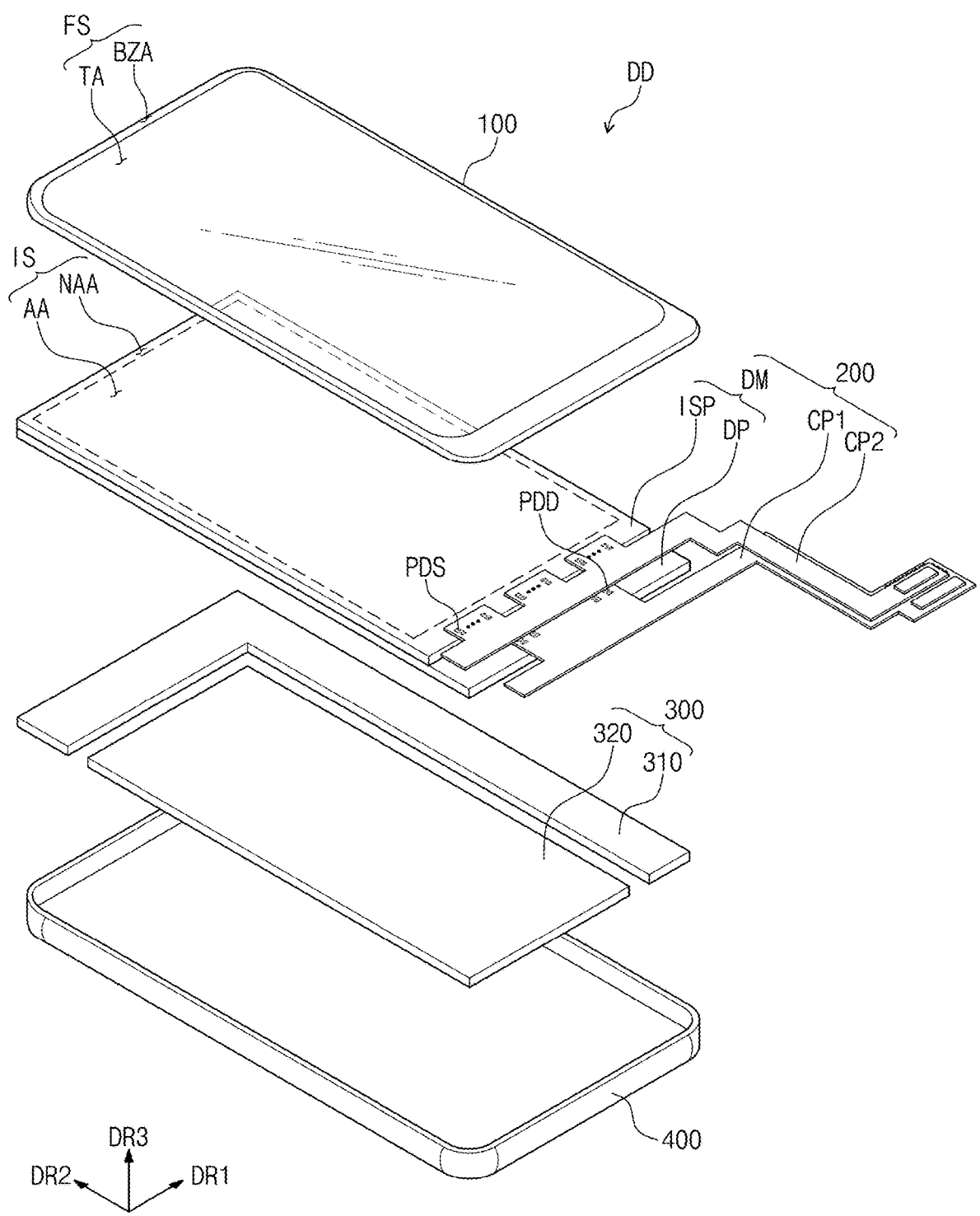
FIG. 2 is an exploded perspective view of an embodiment of a display device according to the invention.

FIG. 1 is a perspective view of an embodiment of a display device according to the invention, and FIG. 2 is an exploded perspective view of an embodiment of a display device according to the invention.

Referring to FIGS. 1 and 2, a display device DD may be a device activated according to an electrical signal. The display device DD may include various embodiments. In embodiments, the display device DD may include a tablet, a laptop, a computer, a smart television, or the like, for example. In the illustrated embodiment, the display device DD is illustratively shown as a smart phone.

The display device DD may display an image IM on a front surface FS. The front surface FS may be defined to be parallel to a plane defined by a first direction DR1 and a second direction DR2 crossing the first direction DR1. The front surface FS may include a transmission area TA and a bezel area BZA adjacent to transmission area TA.

The display device DD may display the image IM on the transmission area TA. The image IM may include at least one of a static image or a dynamic image. In FIG. 1, a watch window and icons are illustrated as examples of the image IM.

The transmission area TA may have a quadrangular shape parallel to each of the first direction DR1 and the second direction DR2. However, this is merely illustrated as an example. The transmission area TA in an embodiment of the invention may have various shapes and is not limited to one embodiment.

The bezel area BZA may have a predetermined color. The bezel area BZA may be an area having light transmittance lower than that of the transmission area TA. The bezel area BZA may be adjacent to the transmission area TA. The bezel area BZA may define a shape of the transmission area TA. The bezel area BZA may surround the transmission area TA. However, this is merely illustrated as an example. The bezel area BZA in an embodiment of the invention may be disposed adjacent to only one side of the transmission area TA or may be omitted.

The normal direction of the front surface FS may correspond to the thickness direction DR3 (hereinafter, also referred to as a third direction) of the display device DD. In the embodiment, a front surface (or a top surface) and a rear surface (or a bottom surface) for each member are defined with respect to the direction in which the image IM is displayed. The front surface and the rear surface may face each other in the third direction DR3. The third direction DR3 may be a direction crossing both the first direction DR1 and the second direction DR2. The first direction DR1, the second direction DR2, and the third direction DR3 may be perpendicular to each other.

Here, directions indicated as the first direction DR1, the second direction DR2, and the third direction DR3 have relative concepts and thus may be changed to other directions. Also, the plane defined by both the first direction DR1 and the second direction DR2 in this specification is defined as a plan view, and "a plan view" may be defined as a view in the third direction DR3.

The display device DD in an embodiment of the invention may sense an external input TC applied from the outside. The external input TC may include various types of external inputs such as a portion of the user's body, light, heat, pressure, or the like. Also, the display device DD may sense an input in contact with the display device DD and an input approaching the display device DD.

The display device DD may include a window 100, an electronic module 200, a control module 300, and an outer case 400. The window 100 and the outer case 400 in an embodiment of the invention may be coupled to each other to define the exterior of the display device DD.

The window 100 may be disposed on the electronic module 200 to cover a front cover IS of the electronic module 200. The window 100 may include an optically transparent insulating material. In an embodiment, the window 100 may include a glass substrate, a sapphire substrate, a plastic film, or the like, for example. The window 100 may have a multi- or single-layered structure. In an embodiment, the window 100 may have a stacked structure in which a plurality of plastic films are coupled through adhesives, or a stacked structure in which the glass substrate is coupled to the plastic film through the adhesive, for example.

The window 100 may include the front surface FS exposed to the outside. The front surface FS of the display device DD may be substantially defined by the front surface FS of the window 100.

The electronic module 200 may be disposed below the window 100. The electronic module 200 may display the image IM and sense the external input TC. The electronic module 200 may include the front surface IS that includes a display area AA and a non-display area NAA. The display area AA may be an area which is activated according to an electrical signal.

The display area AA in an embodiment of the invention may be an area on which the image IM is displayed and on which an external input TC is sensed. The transmission area TA may overlap the display area AA. In an embodiment, the transmission area TA may overlap the entire surface of the display area AA or at least a portion of the display area AA, for example. Accordingly, a user may view the image IM through the transmission area TA and provide the external input TC. However, this is merely an example. Within the display area AA in an embodiment of the invention, the area on which the image IM is displayed and the area on which the external input TC is sensed may be separated from each other and are not limited to one embodiment.

The non-display area NAA may be an area that is covered by the bezel area BZA. The non-display area NAA may be adjacent to the display area AA. The non-display area NAA may surround the display area AA. In the non-display area NAA, a driving circuit, a driving wire, or the like may be disposed.

The electronic module 200 in an embodiment of the invention may be assembled in a flat state in which the display area AA and the non-display area NAA face the window 100. However, this is merely illustrated as an example. A portion of the non-display area NAA in an embodiment of the invention may be bent. Here, the portion of the non-display area NAA faces the bottom surface of the electronic module 200, and thus the bezel area BZA on the front surface of the display device DD may be reduced. However, this is merely an example. The non-display area NAA in an embodiment of the invention may be omitted.

The electronic module 200 may include a display module DM, a first circuit CP1, and a second circuit CP2. The display module DM may include a display panel DP and an input sensor ISP.

The display panel DP may substantially generate the image IM. The image IM generated by the display panel DP is displayed on the front surface IS through the display area AA, and thus may be viewed by the user from the outside through the transmission area TA. The display panel DP in an embodiment of the invention may be a light emitting display panel, but is not particularly limited thereto. In an embodiment, the display panel DP may be an organic light emitting display panel or a quantum-dot light emitting display panel, for example. A light emitting layer of the organic light emitting display panel may include an organic light emitting material. In an embodiment, a light emitting layer of the quantum-dot light emitting display panel may include quantum dots, quantum rods, or the like, for example.

The input sensor ISP may be disposed on the display panel DP. The input sensor ISP may sense the external input TC which is applied from the outside.

The first circuit CP1 may be electrically connected to the display panel DP. The first circuit CP1 may connect the display panel DP and a controller 310. The first circuit CP1 may be connected to display pads PDD of the display panel DP disposed in the non-display area NAA. The first circuit CP1 may provide the display panel DP with an electrical signal for driving the display panel DP. The electrical signal may be generated in the controller 310.

The second circuit CP2 may be electrically connected to the input sensor ISP. The second circuit CP2 may connect the input sensor ISP and the controller 310. The second circuit CP2 may be connected to sense pads PDS of the input sensor ISP disposed in the non-display area NAA. The second circuit CP2 may provide the input sensor ISP with an electrical signal for driving the input sensor ISP. The electrical signal may be generated in the controller 310.

However, this is merely an example. In each of the first circuit CP1 and the second circuit CP2 in an embodiment of the invention, a circuit chip (not shown) may be embedded in a chip on film ("COF") manner, for example. On the basis of a control signal transmitted from the controller 310, the circuit chip may generate an electrical signal desired to operate the display panel DP or the input sensor ISP.

The control module 300 may be disposed below the electronic module 200. The control module 300 may include the controller 310 and a power supply 320.

The controller 310 may provide an electrical signal to the electronic module 200. The controller 310 may include various functional modules for driving the electronic module 200, connectors for supplying power, or the like. In embodiments, the functional modules may include a wireless communication module, an image input module, a sound input module, a memory, an external interface, a light emitting module, a light receiving module, a camera module, or the like, for example. The functional modules may be embedded in a mother board. In an embodiment, the mother board may include a rigid printed circuit board, for example. Some of the functional modules may not be embedded in the mother board, but may be electrically connected to the mother board through a flexible circuit film.

Each of the first circuit CP1 and the second circuit CP2 may be connected to the controller 310. However, this is merely an example. In an embodiment of the electronic module 200 according to the invention, the display panel DP and the input sensor ISP may be connected to different controllers 310, or one of the first circuit CP1 and the second circuit CP2 may not be connected to the controller 310. The electronic module 200 is not limited to one embodiment.

The power supply 320 may supply power desired for overall operations of the display device DD. The power supply 320 may include a general battery module.

The outer case 400 may be disposed below the control module 300. In conjunction with the window 100, the outer case 400 may define the exterior of the display device DD. The outer case 400 may include a material that is relatively rigid compared to that of the electronic module 200.

The outer case 400 having one body is illustrated as an example in an embodiment of the invention, but the outer case 400 in an embodiment of the invention may have a plurality of bodies which are assembled to each other, for example. In an embodiment, the outer case 400 may include a plurality of frames and/or plates having glass, plastic, and metal, for example. The outer case 400 may provide a predetermined accommodation space. The electronic module 200 and the control module 300 are accommodated in the accommodation space and thus may be protected from external impacts.

Figure 3:
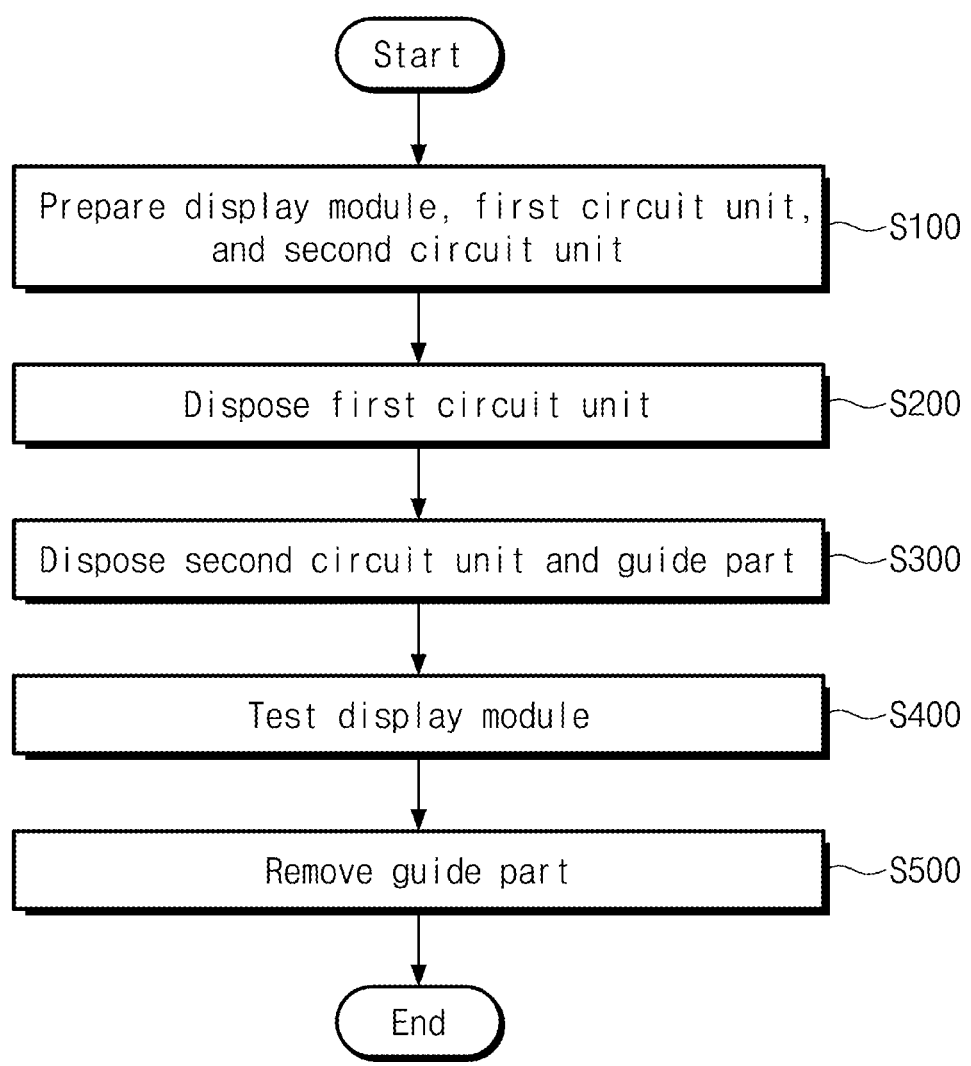
FIG. 3 is a flowchart illustrating an embodiment of a display module testing method according to the invention.
Figure 4:
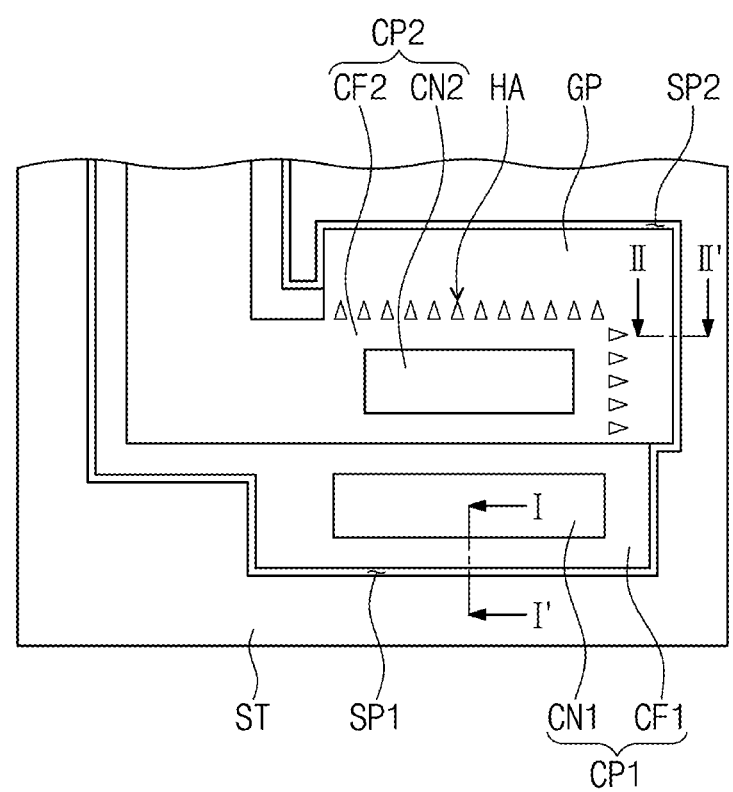
FIG. 4 is a plan view illustrating an embodiment of a first circuit and a second circuit disposed on a stage according to the invention.

FIG. 3 is a flowchart illustrating an embodiment of a display module testing method according to the invention, and FIG. 4 is a plan view illustrating an embodiment of a first circuit and a second circuit disposed on a stage according to the invention.

Referring to FIGS. 3 and 4, a first mounting part SP1 and a second mounting part SP2 may be defined in a stage ST. Each of the first mounting part SP1 and the second mounting part SP2 may represent an area which is recessed from the top surface of the stage ST.

The display module DM (refer to FIG. 2), a first circuit CP1 connected to the display module DM (refer to FIG. 2), and a second circuit CP2 connected to the display module DM (refer to FIG. 2) and connected to a guide part GP are prepared (S100).

The first circuit CP1 may be disposed on the first mounting part SP1 of the stage ST (S200). The position of the first circuit CP1 disposed on the stage ST may be guided by the first mounting part SP1.

The first circuit CP1 may include a first circuit film CF1 and a first connector CN1. The first circuit film CF1 may be a flexible circuit film. The first circuit film CF1 may transmit a signal, which is transmitted through the first connector CN1, to the display panel DP (refer to FIG. 2).

The first connector CN1 may be disposed on the first circuit film CF1. The first connector CN1 may be a board-to-board connector. The board-to-board connector may be constituted by a female connector holder in which a plurality of female terminals is symmetrically coupled to each other in rows or a male connector holder in which a plurality of male terminals is symmetrically coupled to each other in rows. However, this is merely an example. The type of the first connector CN1 in an embodiment of the invention is not limited to the example described above, and may include another type of the connector.

The second circuit CP2 and the guide part GP may be disposed on the first circuit CP1 and the stage ST (S300). The position of the second circuit CP2 may be guided by the second mounting part SP2.

The second circuit CP2 may include a second circuit film CF2 and a second connector CN2. The second circuit film CF2 may be disposed on the first circuit film CF1. The second circuit film CF2 may be a flexible circuit film. The second circuit film CF2 may transmit a signal, which is transmitted through the second connector CN2, to the input sensor ISP (refer to FIG. 2).

The second connector CN2 may be disposed on the second circuit film CF2. The second circuit film CF2 and the second connector CN2 may overlap the first circuit film CF1 in a plan view. The first connector CN1 and the second connector CN2 may not overlap each other in the plan view. The second connector CN2 may have the substantially same configuration as the first connector CN1.

The guide part GP and the second circuit film CF2 may be provided unitarily with each other. That is, the guide part GP may be a flexible circuit film. A portion of the guide part GP may not overlap the first circuit CP1 in the plan view. In an embodiment, the guide part GP may be provided as protruding from an area of the second circuit film CF2 in the first direction DR1 and the second direction DR2, for example.

When the guide part GP is not provided as the embodiment of the invention, the entire second circuit CP2 may overlap the first circuit CP1. Thus, the position of the second circuit CP2 may not be guided by the mounting parts SP1 and SP2 provided in the stage ST. In a case in which the position of the second circuit CP2 is misaligned, coupling failure such as damage to a pin of the second connector CN2 or deformation of the second connector CN2 may occur when a second test connector TC2 (refer to FIG. 7) is connected to the second connector CN2. However, in the embodiment of the invention, the portion of the guide part GP connected to the second circuit CP2 may not overlap the first circuit CP1 in the plan view. The guide part GP may be guided through the second mounting part SP2. The second circuit CP2 may be disposed at a designated position. Thus, the coupling failure may be prevented from occurring when connecting a first test connector TC1 (refer to FIG. 7) and the second test connector TC2 (refer to FIG. 7) to the first connector CN1 and the second connector CN2, respectively. Therefore, the display module testing method having the improved reliability may be provided.

A plurality of holes HA may be defined in a boundary between the second circuit film CF2 and the guide part GP. The plurality of holes HA may be defined in the first direction DR1 and the second direction DR2. Each of the plurality of holes HA may have a triangular shape. However, this is merely an example. Each of the plurality of holes HA in an embodiment of the invention may have various shapes enabling the guide part GP to be easily removed. The plurality of holes HA may overlap the first circuit film CF1 in the plan view.

Figure 5:
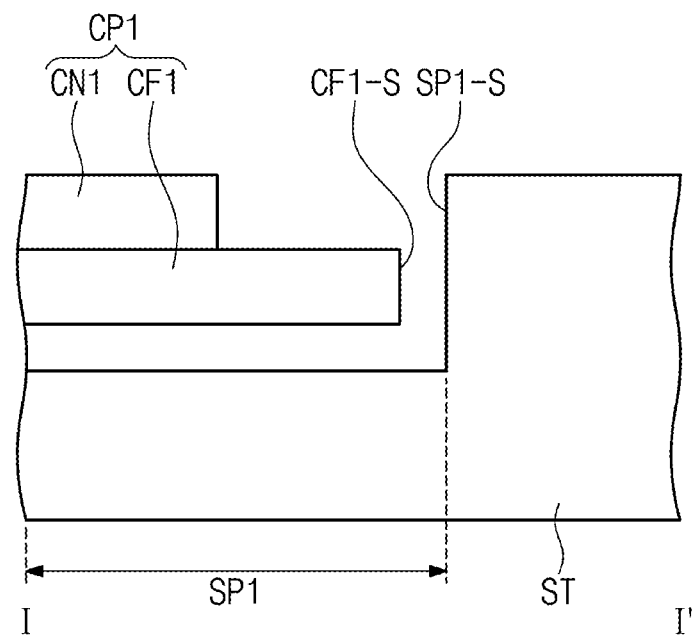
FIG. 5 is a cross-sectional view taken along line I-I' of an embodiment of FIG. 4 according to the invention.
Figure 5:
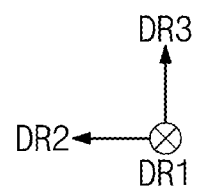

FIG. 5 is a cross-sectional view taken along line I-I' of an embodiment of FIG. 4 according to the invention.

Referring to FIGS. 3 to 5, in the process (S200) of disposing the first circuit CP1, a side surface CF1-S of the first circuit film CF1 may face a side surface SP1-S of the first mounting part SP1.

According to the embodiment of the invention, the first circuit CP1 may be disposed on the first mounting part SP1. The first circuit CP1 may be guided by the first mounting part SP1. The first circuit CP1 may be disposed at a designated position. The first test connector TC1 (refer to FIG. 7) may be coupled to the first connector CN1. The coupling failure may be prevented from occurring when coupling the connectors. Therefore, the display module testing method having the improved reliability may be provided.

Figure 6:
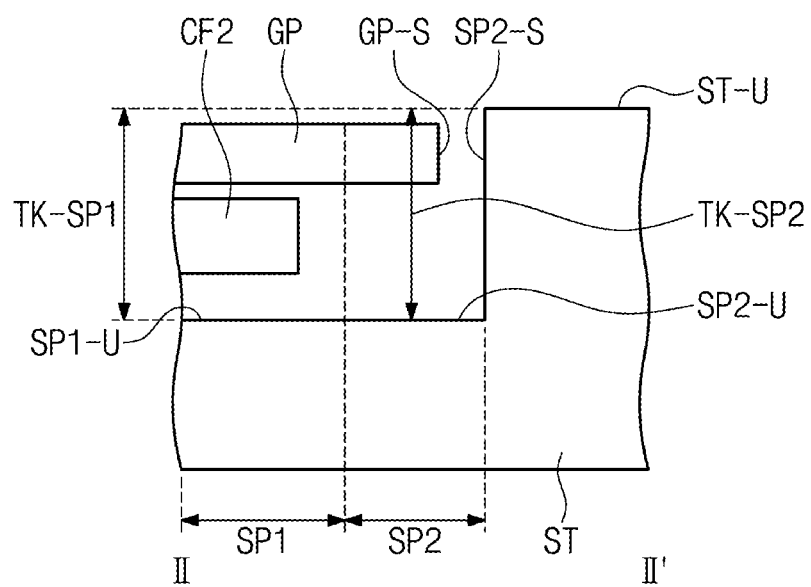
FIG. 6 is a cross-sectional view taken along line II-IP of an embodiment of FIG. 4 according to the invention.

FIG. 6 is a cross-sectional view taken along line II-IP of an embodiment of FIG. 4 according to the invention.

Referring to FIGS. 3, 4, and 6, in the process (S300) of disposing the second circuit CP2 and the guide part GP, a side surface GP-S of the guide part GP may face a side surface SP2-S of the second mounting part SP2.

According to the embodiment of the invention, the guide part GP may be disposed on the second mounting part SP2. The guide part GP may be guided by the second mounting part SP2. The second circuit CP2 may be disposed at a designated position. The second test connector TC2 (refer to FIG. 7) may be coupled to the second connector CN2. The coupling failure may be prevented from occurring when coupling the connectors. Therefore, the display module testing method having the improved reliability may be provided.

In an embodiment of the invention, a first depth TK-SP1 from a top surface ST-U of the stage ST to a top surface SP1-U of the first mounting part SP1 is illustrated as being equal to a second depth TK-SP2 from the top surface ST-U of the stage ST to a top surface SP2-U of the second mounting part SP2. However, the invention is not limited thereto. In an embodiment of the invention, the second depth TK-SP2 may be less than the first depth TK-SP1, for example. Thus, the second mounting part SP2 may easily guide the guide part GP.

Figure 7:
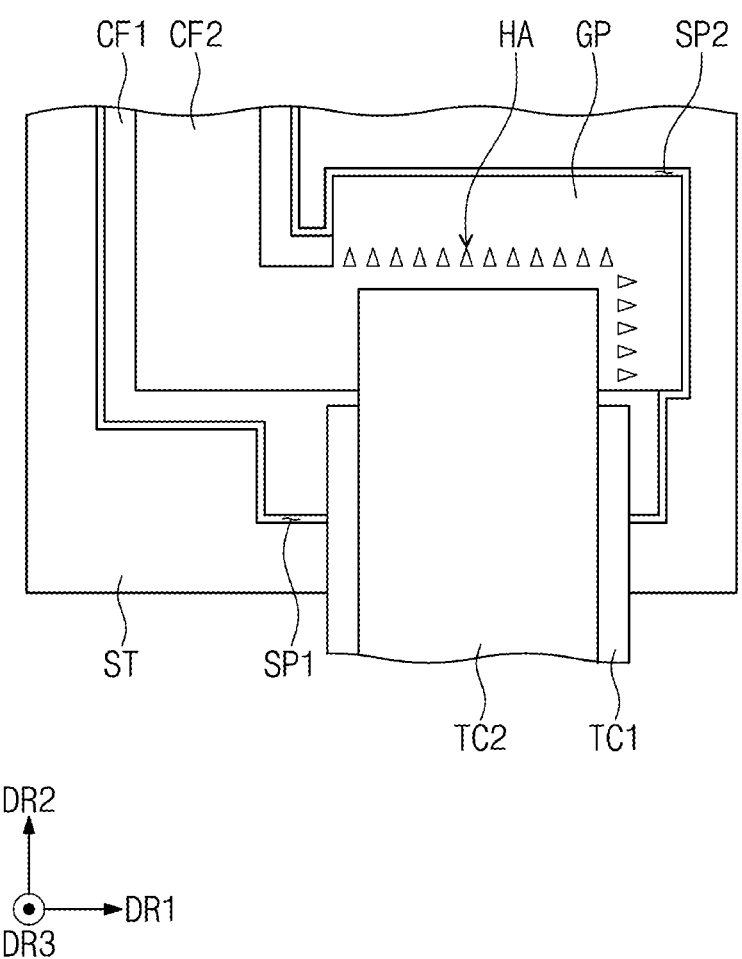
FIG. 7 is a plan view illustrating a process of testing a display module according an embodiment of the invention.

FIG. 7 is a plan view illustrating a process of testing a display module according an embodiment of the invention. In describing FIG. 7, the same reference symbols are given to the components described through FIG. 4, and duplicated descriptions thereof will be omitted.

Referring to FIGS. 3 and 7, a display module testing device may include the first test connector TC1 and the second test connector TC2. In a process (S400) of testing the display module DM, the first test connector TC1 may be connected to the first connector CN1 (refer to FIG. 4). A display test signal may be provided to the first connector CN1 (refer to FIG. 4) through the first test connector TC1. The display test signal may be provided to the display panel DP (refer to FIG. 2). The display module testing device may test an operation of the display panel DP (refer to FIG. 2).

The second test connector TC2 may be connected to the second connector CN2 (refer to FIG. 4). An input test signal may be provided to the second connector CN2 (refer to FIG. 4) through the second test connector TC2. The input test signal may be provided to the input sensor ISP (refer to FIG. 2). The display module testing device may test an operation of the input sensor ISP (refer to FIG. 2).

According to the embodiment of the invention, the guide part GP may be guided by the second mounting part SP2. The second circuit CP2 may be disposed at a designated position. The second test connector TC2 may be stably coupled to the second connector CN2 (refer to FIG. 4). Failures such as mold sinking, pin sinking, abnormal driving, or the like may be prevented from occurring in the second connector CN2 (refer to FIG. 4). Therefore, the display module testing method having the improved reliability may be provided.

Figure 8:
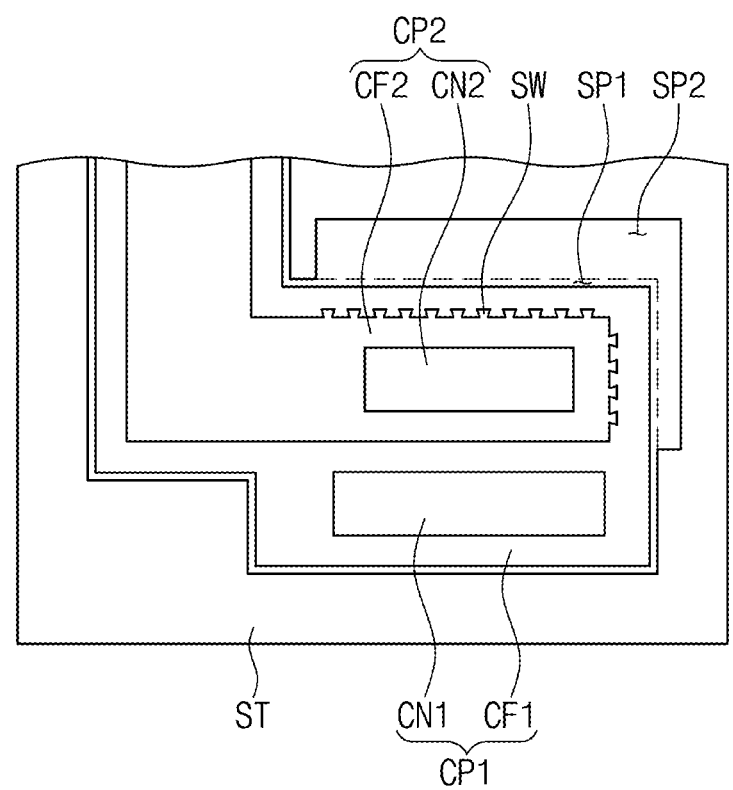
FIG. 8 is a plan view illustrating an embodiment of a process of removing a guide part according to the invention.
Figure 8:
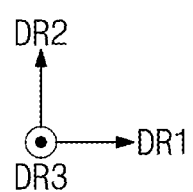

FIG. 8 is a plan view illustrating an embodiment of a process of removing a guide part according to the invention. In describing FIG. 8, the same reference symbols are given to the components described through FIG. 4, and duplicated descriptions thereof will be omitted.

Referring to FIGS. 3 and 8, in a process (S500) of removing the guide part GP (refer to FIG. 4), the guide part GP (refer to FIG. 4) may be removed along a direction in which the plurality of holes HA (refer to FIG. 4) is defined. The plurality of holes HA (refer to FIG. 4) may allow the guide part GP (refer to FIG. 4) to be easily removed.

Protrusions SW may be provided on at least one side surface of the second circuit film CF2 from which the guide part GP (refer to FIG. 4) is removed. The protrusions SW may be provided by removing the plurality of holes HA (refer to FIG. 4).

The guide part GP (refer to FIG. 4) may be removed after the display module DM (refer to FIG. 2) is tested. The display module testing device may use the guide part GP (refer to FIG. 4) to test the display module DM (refer to FIG. 2) without affecting the design of the circuit film.

According to the embodiment of the invention, the second circuit CP2 may overlap the first circuit CP1 in a plan view. A space to be occupied when the first circuit CP1 and the second circuit CP2 are connected to the control module 300 (refer to FIG. 2) may be reduced. Thus, the display device DD (refer to FIG. 2) may be provided to be substantially slim.

The first connector CN1 and the second connector CN2 may not overlap each other in the plan view.

In an embodiment of the display module testing method according to the invention, failures such as mold sinking, pin sinking, abnormal driving, or the like may be prevented from occurring in the first connector CN1 and the second connector CN2. The first connector CN1 and the second connector CN2 may be stably connected to the control module 300 (refer to FIG. 2). Thus, the display device DD (refer to FIG. 2) having improved reliability may be provided.

Figure 9:
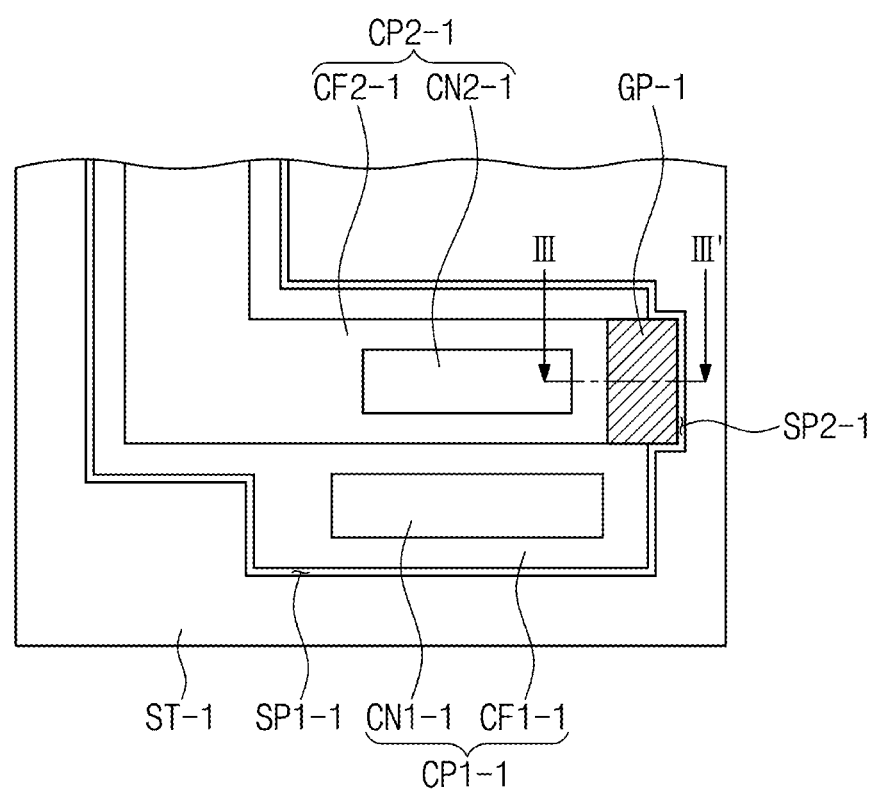
FIG. 9 is a plan view illustrating an embodiment of a first circuit and a second circuit disposed on a stage according to the invention.

FIG. 9 is a plan view illustrating an embodiment of a first circuit and a second circuit disposed on a stage according to the invention.

Referring to FIGS. 3 and 9, the display module DM (refer to FIG. 2), a first circuit CP1-1 connected to the display module DM (refer to FIG. 2), and a second circuit CP2-1 connected to the display module DM (refer to FIG. 2) and connected to a guide part GP-1 are prepared (S100). The first circuit CP1-1 may be disposed on a first mounting part SP1-1 of the stage ST-1 (S200).

The second circuit CP2-1 and the guide part GP-1 may be disposed on the first circuit CP1-1 and a second mounting part SP2-1 of the stage ST-1 (S300).

The guide part GP-1 may be disposed between the first circuit CP1-1 and the second circuit CP2-1. The guide part GP-1 may protrude from the second circuit CP2-1 in a first direction DR1 in a plan view. A portion of the guide part GP-1 may not overlap the first circuit CP1-1 in the plan view.

According to the embodiment of the invention, the guide part GP-1 may be guided by the second mounting part SP2-1. The second circuit CP2-1 may be disposed at a designated position. Thus, the coupling failure may be prevented from occurring when connecting the test connectors to a first connector CN1-1 and a second connector CN2-1. Therefore, the display module testing method having the improved reliability may be provided.

Figure 10:
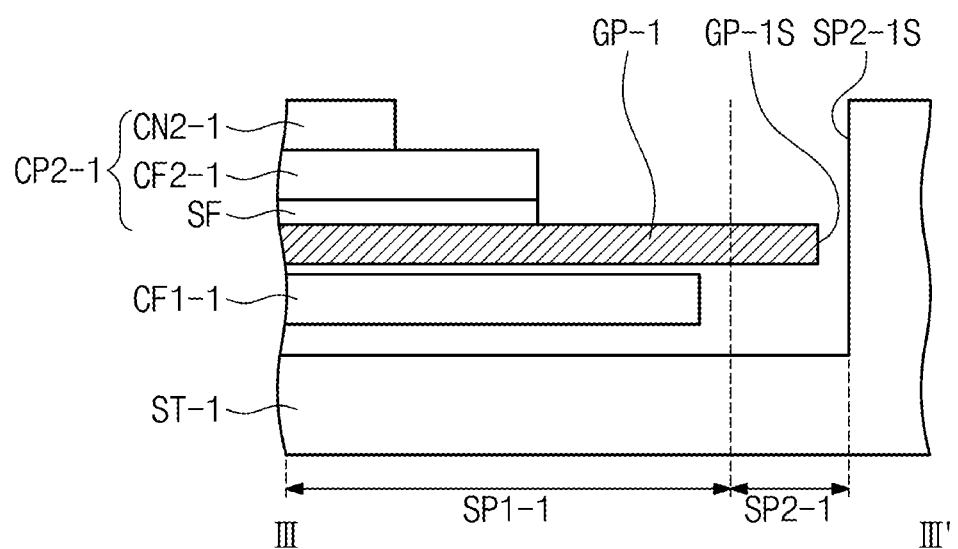
FIG. 10 is a cross-sectional view taken along line III-III' of an embodiment of FIG. 9 according to the invention.
Figure 10:
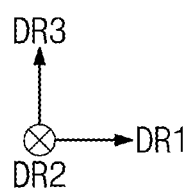

FIG. 10 is a cross-sectional view taken along line III-III' of an embodiment of FIG. 9 according to the invention.

Referring to FIGS. 3, 9, and 10, the second circuit CP2-1 may include a second circuit film CF2-1, the second connector CN2-1, and a reinforcing part SF.

The reinforcing part SF is disposed on first circuit film CF1-1 and below the second circuit film CF2-1 and may support the second connector CN2-1. The reinforcing part SF may be disposed in an area of the second circuit film CF2-1 adjacent to the second connector CN2-1 in the plan view. The reinforcing part SF may be stainless steel.

The guide part GP-1 may be attached to the bottom of the reinforcing part SF. The guide part GP-1 may a magnet. The guide part GP-1 may be coupled to the reinforcing part SF by a magnetic force. The first circuit CP1-1 may be disposed below the guide part GP-1.

In the process (S300) disposing the second circuit CP2-1 and the guide part GP-1, a side surface GP-1S of the guide part GP-1 may face a side surface SP2-1S of the second mounting part SP2-1.

Figure 11:
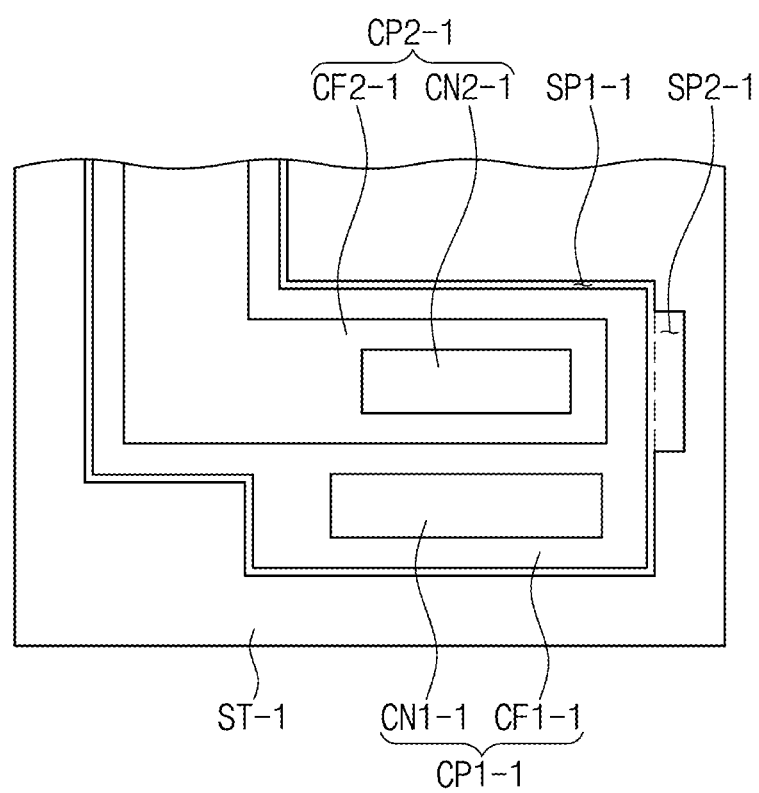
FIG. 11 is a plan view illustrating an embodiment of a process of removing a guide part according to the invention.
Figure 11:
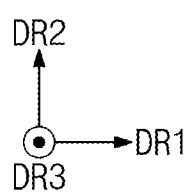

FIG. 11 is a plan view illustrating an embodiment of a process of removing a guide part according to the invention. In describing FIG. 11, the same reference symbols are given to the components described through FIG. 9, and duplicated descriptions thereof will be omitted.

Referring to FIGS. 3 and 11, in the process (S500) of removing the guide part GP-1 (refer to FIG. 9), the guide part GP-1 (refer to FIG. 9) may be removed from the reinforcing part SF.

The guide part GP-1 (refer to FIG. 9) may be removed after the display module DM (refer to FIG. 2) is tested. The display module testing device may use the guide part GP-1 (refer to FIG. 9) to test the display module DM (refer to FIG. 2) without affecting the design of the circuit film.

In an embodiment of the display module testing method according to the invention, failures such as mold sinking, pin sinking, abnormal driving, or the like may be prevented from occurring in the first connector CN1-1 and the second connector CN2-1. The first connector CN1-1 and the second connector CN2-1 may be stably connected to the control module 300 (refer to FIG. 2). Thus, the display device DD (refer to FIG. 2) having improved reliability may be provided.

According to the embodiment of the invention, the portion of the guide part connected to the second circuit may overlap the first circuit in the plan view. The position of the second circuit may be guided by the second mounting part. The second circuit may be disposed at a designated position. Thus, the coupling failure may be prevented from occurring when connecting the first test connector and the second test connector to the first connector and the second connector, respectively. Therefore, the display module testing method having the improved reliability may be provided.

Although described with reference to embodiments of the invention, it will be understood that various changes and modifications of the invention may be made by one ordinary skilled in the art or one having ordinary knowledge in the art without departing from the spirit and technical field of the invention as hereinafter claimed. Hence, the technical scope of the invention is not limited to the detailed descriptions in the specification.

What is claimed is:

1. A display module testing method comprising:
   preparing a display module, a first circuit connected to the display module, and a second circuit connected to the display module and connected to a guide part;
   disposing the first circuit on a first mounting part of a stage;
   disposing the second circuit and the guide part on the first circuit and a second mounting part adjacent to the first mounting part of the stage;
   testing the display module; and
   removing the guide part from the second circuit.

2. The display module testing method of claim 1, wherein the disposing the second circuit and the guide part comprises disposing a portion of the guide part so as not to overlap the first circuit in a plan view.

3. The display module testing method of claim 1, wherein the disposing the second circuit and the guide part comprises disposing a side surface of the guide part to face a side surface of the second mounting part.

4. The display module testing method of claim 1, wherein the first circuit comprises a first circuit film and a first connector disposed on the first circuit film, and
   the second circuit comprises a second circuit film and a second connector disposed on the second circuit film,
   wherein the disposing the second circuit and the guide part comprises disposing the second circuit film and the second connector to overlap the first circuit film in a plan view.

5. The display module testing method of claim 4, wherein the disposing the second circuit and the guide part further comprises disposing the first connector and the second connector so as not to overlap each other in the plan view.

6. The display module testing method of claim 4, wherein the guide part is provided unitarily with the second circuit film.

7. The display module testing method of claim 6, wherein the second circuit film and the guide part are provided unitarily with each other, and
   a plurality of holes is defined in a boundary between the second circuit film and the guide part,
   wherein the removing the guide part comprises removing the guide part along a direction in which the plurality of holes is defined.

8. The display module testing method of claim 7, wherein the disposing the second circuit and the guide part further comprises defining the plurality of holes to overlap the first circuit film in the plan view.

9. The display module testing method of claim 7, wherein the removing the guide part further comprises forming a protrusion on at least one side surface of the second circuit film from which the guide part is removed.

10. The display module testing method of claim 4, wherein the disposing the first circuit comprises disposing a side surface of the first circuit film to face a side surface of the first mounting part.

11. The display module testing method of claim 4, wherein the testing the display module comprises:
    connecting a first test connector of a display module testing device to the first connector; and
    connecting a second test connector of the display module testing device to the second connector.

12. The display module testing method of claim 11, wherein the testing the display module further comprises:
    providing a display test signal to the first connector through the first test connector; and
    providing an input test signal to the second connector through the second test connector.

13. The display module testing method of claim 1, wherein the disposing the second circuit and the guide part comprises disposing the guide part between the first circuit and the second circuit.

14. The display module testing method of claim 13, wherein the second circuit comprises a second circuit film, a second connector disposed on the second circuit film, and a reinforcing part which is disposed below the second circuit film and supports the second connector,
    wherein the disposing the second circuit and the guide part further comprises attaching the guide part to the reinforcing part.

15. The display module testing method of claim 14, wherein the guide part is a magnet.

16. The display module testing method of claim 14, wherein the reinforcing part is stainless steel.

* * * * *